United States Patent
Danesh et al.

(10) Patent No.: US 11,675,011 B2
(45) Date of Patent: Jun. 13, 2023

(54) SWITCH CONDITION MONITORING

(71) Applicant: Analog Devices International Unlimited Company, Limerick (IE)

(72) Inventors: Seyed Amir Ali Danesh, Edinburgh (GB); Jonathan Ephraim David Hurwitz, Edinburgh (GB); William Michael James Holland, Edinburgh (GB); Petre Minciunescu, Summerfield, NC (US)

(73) Assignee: Analog Devices International Unlimited Company, Limerick (IE)

( * ) Notice: Subject to any disclaimer, the term of this patent is extended or adjusted under 35 U.S.C. 154(b) by 527 days.

(21) Appl. No.: 16/541,916

(22) Filed: Aug. 15, 2019

(65) Prior Publication Data
US 2021/0048478 A1 Feb. 18, 2021

(51) Int. Cl.
*G01R 31/327* (2006.01)
*H01H 47/00* (2006.01)
(Continued)

(52) U.S. Cl.
CPC ....... *G01R 31/3275* (2013.01); *H01H 47/002* (2013.01); *H03K 17/08122* (2013.01); *H03K 17/08128* (2013.01); *H02M 7/5387* (2013.01)

(58) Field of Classification Search
CPC .............. G01R 31/327; G01R 31/3271; G01R 31/3275; G01R 31/333; G01R 31/50; G01R 31/52; G01R 31/26; G01R 31/2608; G01R 31/261; G01R 31/2621; G01R 31/2623; G01R 31/2642; G01R 27/00; G01R 27/02;
(Continued)

(56) References Cited

U.S. PATENT DOCUMENTS

| 5,488,323 A | 1/1996 | Beacham, Jr. et al. |
| 6,522,033 B1 | 2/2003 | Nevo |

(Continued)

FOREIGN PATENT DOCUMENTS

| CN | 112394657 | 2/2021 |
| EP | 2317527 | 5/2011 |
| WO | 2016197052 | 12/2016 |

OTHER PUBLICATIONS

English translation of EP2317527. (Year: 2011).*
(Continued)

*Primary Examiner* — Thienvu V Tran
*Assistant Examiner* — Carlos O Rivera-Perez
(74) *Attorney, Agent, or Firm* — Schwegman Lundberg & Woessner, P.A.

(57) ABSTRACT

This disclosure relates to monitoring the condition of electrical/electronic switches over time by monitoring the impedance of the switch. The condition of switches can degrade as they age, which can reduce their performance and may ultimately lead to failure. In many applications, particularly high-voltage applications, the reliable operation of switches may be very important and failures can present a safety risk and cause costly unscheduled system downtime for repairs. It has been realised that as the condition of switches change, their impedance changes, so monitoring the impedance can give a good indication of the condition of the switch, enabling potential faults/failures to be identified early and acted upon pre-emptively.

20 Claims, 5 Drawing Sheets

(51) Int. Cl.
*H03K 17/0812* (2006.01)
*H02M 7/5387* (2007.01)

(58) Field of Classification Search
CPC ........ G01R 27/08; G01R 27/14; G01R 27/16; G01R 27/18; G01R 27/20; G01R 27/205; H03K 17/08; H03K 17/0812; H03K 17/08122; H03K 17/08126; H03K 17/08128; H01H 47/002; H01H 71/04; H01H 71/042; H01H 71/044; H01H 9/54; H01H 9/542; H01H 1/0015; H01H 2071/04; H01H 2071/044; H01H 1/00; H02M 7/53; H02M 7/537; H02M 7/5387; H02M 7/53871; G05B 19/0428; G05B 2219/24024
USPC ........ 702/57, 58, 59, 64; 361/78, 79, 86, 87, 361/88–102
See application file for complete search history.

(56) References Cited

U.S. PATENT DOCUMENTS

| | | | |
|---|---|---|---|
| 7,265,555 | B2 | 9/2007 | Batten et al. |
| 8,278,932 | B2* | 10/2012 | Quinones ............... H03K 17/18 324/418 |
| 9,506,992 | B2* | 11/2016 | Baraszu ............... G01R 31/392 |
| 2003/0025515 | A1* | 2/2003 | Mulera ............... G01R 31/008 324/713 |
| 2013/0103334 | A1* | 4/2013 | Delbaere ............ G01R 19/0046 702/57 |
| 2016/0169945 | A1 | 6/2016 | Mauder et al. |
| 2017/0254842 | A1* | 9/2017 | Bahl ................... G01R 19/0084 |
| 2017/0302151 | A1* | 10/2017 | Snook .................. H03K 17/063 |

OTHER PUBLICATIONS

"European Application Serial No. 20187852.7, Extended European Search Report dated Jan. 12, 2021", 5 pgs.
"European Application Serial No. 20187852.7, Communication Pursuant to Article 94(3) EPC dated Oct. 12, 2022", 4 pgs.

* cited by examiner

SWITCH CONDITION MONITORING

TECHNICAL FIELD

The present disclosure relates to monitoring of the condition of electrical/electronic switches.

BACKGROUND

There are many different types of electrical/electronic switch available for different applications. These include, by way of example, electromechanical switches such as circuit breakers and relays, and solid-state switches, such as transistors (for example, bipolar transistors, IGBTs, FETs, etc), solid-state relays and thyristors. The reliable operation of these switches may be important to the on-going safe and reliable operation of the circuits in which they are used. For example, circuit breakers may be used in electrical power protection circuits and their continued reliable operation over time may be important for the safe operation of the protection circuit. Likewise, solid-state switches such as IGBTs or FETs may be used in power electrical circuits, such as power conversion circuits or inverters, and may be important in the continued reliable and safe operation of the power electrical circuits.

However, the condition of switches may change over time, which may affect their performance and reliability. For example, in an electrical power protection circuit, the protection switch (for example, a relay) is usually closed and is opened when a fault condition is detected. Over time, the condition of the switch may deteriorate, for example the switch mechanism may wear, particularly when the switch is regularly opened and closed. Furthermore, electrical contact point corrosion may take place. This may cause the switch to change state (for example, opening or closing) more slowly, which would reduce the effectiveness of the protection circuit, or even cause it to fail altogether. It may also cause the on-state/closed state impedance of the switch to increase resulting in greater losses in the switch, self-heating and potentially fire.

In a further example, the switches in electrical conversion circuits are often the point of failure in the circuit. This may be caused by over current/voltage conditions during operation as a result of misuse or kickback from the load (for example, where the conversion circuit is used to drive an AC motor). Another source of switch condition deterioration over time is harsh environmental conditions in which the switch operates. Condition degradation over time can reduce the precision of the electrical conversion circuit (for example, it may limit the precision of the AC signal generated by an inverter, which may cause problems for downstream equipment/circuits) and ultimately lead to failure of the switch, causing unexpected system downtime.

SUMMARY

This disclosure relates to monitoring the condition of electrical/electronic switches over time by monitoring the impedance of the switch. The condition of switches can degrade as they age, which can reduce their performance and may ultimately lead to failure. In many applications, particularly high-voltage applications, the reliable operation of switches may be very important and failures can present a safety risk and cause costly unscheduled system downtime for repairs. It has been realised that as the condition of switches change, their impedance changes, so monitoring the impedance can give a good indication of the condition of the switch, enabling potential faults/failures to be identified early and acted upon pre-emptively.

In a first aspect of the disclosure, there is provided a system for monitoring a condition of a switch, the system comprising: a switch condition monitor unit configured to: determine a plurality of measurements of impedance of the switch over time; and monitor the condition of the switch based at least in part on the plurality of measurements of impedance.

At least some of the plurality of measurements of impedance may be determined while the switch is in a conducting state.

The switch condition monitor unit may be configured to monitor the condition of the switch by comparing at least one of the plurality of measurements of conducting state impedance against a reference impedance.

The reference impedance may be based on at least one earlier measurement of conducting state impedance of the switch.

The reference impedance may be based on an average of two or more earlier measurements of conducting state impedance of the switch.

The switch condition monitor unit may be further configured to: if a difference between the at least one of the plurality of measurements of conducting state impedance and the reference impedance is greater than a fault threshold, the switch condition monitor unit is configured to generate a switch fault alert.

The switch is a high voltage switch that is rated to withstand a high voltage (i.e., a voltage that exceeds the safe operating voltage of the switch condition monitor) when the switch is in a non-conducting state, and wherein the switch condition monitor unit is configured to determine the plurality of measurements of impedance of the switch by: determining a plurality of measures of voltage across the switch and a corresponding plurality of measures of current passing through the switch; and determining the plurality of measurements of impedance of the switch based on the plurality of measures of voltage across the switch and corresponding plurality of measures of current passing through the switch.

The system further comprises: a voltage divider unit for coupling to the switch, wherein the voltage divider unit is configured to produce a voltage measurement signal that is dependent on, but smaller in magnitude than, the voltage across the switch, wherein the switch condition monitor unit is coupled to the voltage divider unit and configured to determine the plurality of measures of voltage across the switch based at least in part on the voltage measurement signal.

The voltage divider unit comprises: a potential divider for coupling to the high voltage switch, wherein the potential divider comprises two impedance elements, one of which has a larger impedance than the other, wherein the voltage measurement signal is indicative of a voltage across the smaller impedance element of the potential divider.

The potential divider may be for coupling across, in parallel with, the switch.

The two impedance elements may both be resistors, or one of the impedance elements may be a capacitor and the other impedance element is a resistor.

The larger impedance element may have an impedance that is at least 100 times larger than the smaller impedance element. The larger impedance element may have an impedance of at least 1 MΩ.

The switch condition monitor unit may be further configured to determine the plurality of measures of voltage across the switch based at least in part on a ratio of impedances of the two impedance elements.

The voltage divider unit may comprise: a first pair of impedance elements for coupling to a first switch terminal of the high voltage switch, the first pair of impedance elements comprising a first impedance element having a first impedance and a second impedance element having a second impedance, wherein the first impedance is greater than the second impedance; and a second pair of impedance elements for coupling to a second switch terminal of the high voltage switch, the second pair of impedance elements comprising a third impedance element having a third impedance and a fourth impedance element having a fourth impedance, wherein the third impedance is greater than the fourth impedance.

The voltage measurement signal may comprise: a first voltage signal indicative of a voltage across the second impedance element relative to a reference voltage, and a second voltage signal indicative of a voltage across the fourth impedance element relative to the reference voltage.

Determination of the measure of the voltage across the switch may be based at least in part on a difference between the first voltage signal and the second voltage signal.

Determination of the measure of the voltage across the high voltage switch may be further based at least in part on a ratio of the first impedance and the second impedance and a ratio of the third impedance and the fourth impedance.

The voltage divider unit may comprise: a plurality of chop switches operable in a first coupling state and a second coupling state, wherein when the plurality of chop switches are in the first coupling state, they are configured to: couple the first impedance element to the second impedance element to form a first potential divider; and couple the third impedance element and the fourth impedance element to form a second potential divider; and wherein when the plurality of chop switches are in the second coupling state, they are configured to: couple the first impedance element to the fourth impedance element to form a third potential divider; and couple the third impedance element and the second impedance element to form a fourth potential divider.

Determination of the measure of the voltage across the high voltage switch may be further based at least in part on: the voltage measurement signal when the plurality of chop switches are in the first coupling state; and the voltage measurement signal when the plurality of chop switches are in the second coupling state.

The first pair of impedance elements may form a first fixed potential divider and the second pair of impedance elements may form a second fixed potential divider.

The first impedance may be substantially the same as the third impedance, and the second impedance may be substantially the same as the fourth impedance.

The switch may be an electromechanical switch, or an IGBT, or a FET.

In a second aspect of the disclosure, there is provided a high voltage circuit comprising: a high voltage power source (i.e., a power source that supplies a voltage that exceeds the safe operating voltage of a voltage measurement device used in the switch impedance determination system); a load for receiving power from the high voltage power source; a high voltage switch arranged to couple the high voltage power source to the load when in a conducting switch state and decouple the high voltage power source from the load when in a non-conducting switch state; and the switch impedance determination system of any preceding claim, coupled to the high voltage switch and configured to monitor the condition of the high voltage switch.

The high voltage circuit may further comprise: a current measurement device configured to generate the current signal indicative of a current passing through the high voltage switch.

In a third aspect of the disclosure, there is provided a method of monitoring a condition of a switch, the method comprising determining a plurality of measurements of impedance of the switch over time; and monitoring the condition of the switch based at least in part on the plurality of measurements of impedance.

DRAWINGS

Aspects of the present disclosure are described, by way of example only, with reference to the following drawings, in which.

DETAILED DESCRIPTION

The inventors have recognised that switch aging over time typically leads to changes in the impedance of the switch, for example when it is in its conducting ('on' or 'closed') state. For example, when a switch is new, it should have a relatively low conducting state impedance. However, as its condition degrades over time, this impedance may change, most typically increasing. By monitoring the impedance of the switch over time, the condition of the switch may be monitored. In this way, changes in the condition of the switch may be observed, which makes it possible to detect a potential fault in the switch before the fault becomes critical. Appropriate action, for example replacing the switch, may then be taken pre-emptively at a convenient time, thereby improving the long term safe and reliable operation of the circuit in which the switch operates, whilst minimising system downtown for maintenance and repair.

Monitoring the impedance of high-voltage switches may be a particular challenge. A high voltage switch is one that is rated to withstand a high voltage (for example, a voltage that is considered unsafe for humans, such as voltages in excess of 42.4 DC/30V RMS in accordance with US standard UL 508A) when the switch is in a non-conducting ('open' or 'off') state. This means that when the switch is in a non-conducting state, there is likely to be a high voltage across it. However, when it is in a conducting state ('closed' or 'on'), the switch should have a relatively low impedance and therefore a relatively low voltage across it. The conducting state impedance of the switch may be determined by measuring the voltage across the switch, and the current following through the switch, when it is in its on-state. This is likely to require a voltage measurement system (such as an integrated ADC, which is an ADC formed as part of an IC) capable to measuring relatively small voltages to a relatively high degree of accuracy. Typically, such devices are rated to withstand only relatively small voltages (usually up to a few volts, or less). However, if the switch were to change to its non-conducting state, the voltage across the switch would suddenly increase to a high-voltage, which is likely to damage the voltage measurement system.

For the purpose of this disclosure, a 'high' voltage is a voltage that exceeds the safe operating voltage of the voltage measurement system that is used to measure the voltage across the switch. Consequently, a high voltage switch is a switch that is suitable for coupling to a 'high' voltage, such that when the switch is in a non-conducting state, there will be a voltage across it that exceeds the safe operating limits of the voltage measurement device that is used to measure the voltage across the switch.

Figure 1A:
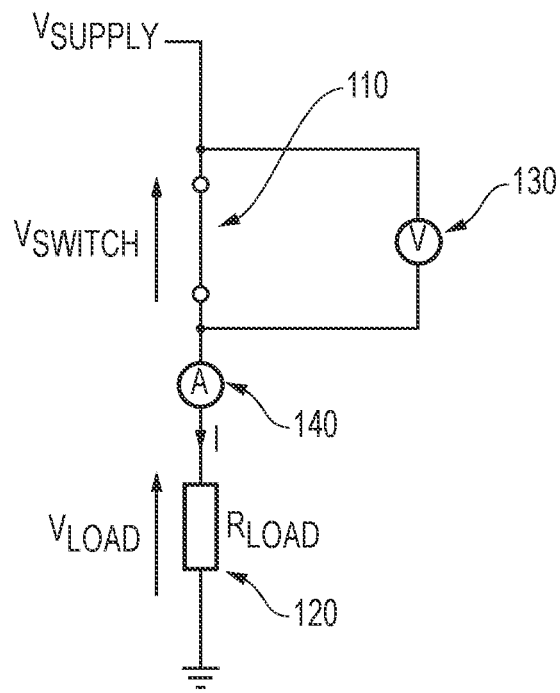
FIGS. 1A and 1B show an example circuit demonstrating voltages across a high-voltage switch in conducting and non-conducting states.
Figure 1B:
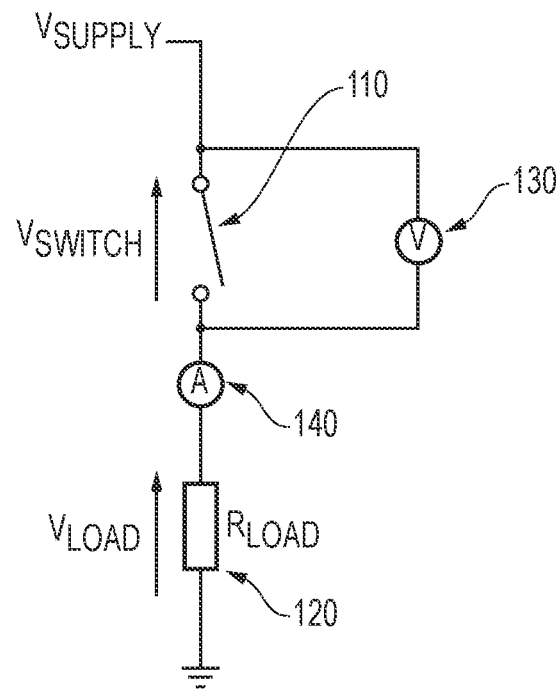

The inventors have addressed this issue with the use of a voltage divider unit for coupling to the high voltage switch, wherein the voltage divider unit is configured to generate a voltage measurement signal that is dependent on, but smaller in magnitude than, the voltage across the high voltage switch. The voltage measurement system may then measure this reduced voltage and then derive a measurement of the actual voltage across the switch. By dividing down the switch voltage in this way, the voltage seen by the measurement system when the switch is in a non-conducting state may be kept within the safe limits of the measurement system. Whilst the relatively small voltage seen by the measurement system when the switch is in a conducting state would also be reduced to an even smaller voltage, the inventors have recognised that it would still be within the accurately measureable limits of a number of voltage measurement systems. Furthermore, the voltage divider unit is a passive unit, in that it does not require control or power to be supplied to it for its operation and is always coupled to the switch (in contrast to an active system, which may require control and/or power and may involve selective coupling and decoupling of the measurement system to the switch in order to measure the voltage only at specific times). By using a passive voltage divider unit, the system may be able to monitor the conducting state impedance of the switch more straightforwardly, at any time, without requiring complex control, whilst still being able to withstand sudden, unexpected increases in switch voltages caused by the switch opening (which may be particularly useful for protection/circuit breaker circuits). Consequently, the system may be more straightforward and lower cost to implement and operate, and may require less power to operate over time FIGS. 1A and 1B show an example circuit demonstrating voltages across a high-voltage switch 110 in conducting and non-conducting states. The switch 110 may be any type of switch, such as any of the examples in given in the 'background' section. FIG. 1A shows the switch 110 in a conducting ('closed' or 'on' state). Current, I, flows through the switch 110 and the load 120 and is measureable by a current sensor 140 (for example a current shunt or current transformer). The impedance of the load $R_{LOAD}$ is relatively high compared with the impedance of the switch 110 when in the conducting state. Therefore, the voltage across the load $V_{LOAD}$ takes most of the supply voltage $V_{SUPPLY}$ and the voltage across the switch $V_{SWITCH}$ is relatively low. For example, if $V_{SUPPLY}$ is a high voltage, for example a voltage in excess of 50V DC or RMS, such as 200V, $V_{SWITCH}$ may be approximately 0.001-0.5V and $V_{LOAD}$ may be approximately 199.5-199.999V (if $V_{SUPPLY}$ is 200V). The voltage sensor 130 is coupled across, in parallel with, the switch 110 in order to measure $V_{SWITCH}$ and is designed to operate at relatively low voltages (for example, under 5V) in order to measure accurately $V_{SWITCH}$ when the switch 110 is conducting. The voltage sensor 130 may be any suitable type of voltage sensor, for example an ADC or an integrated ADC. The conducting-state impedance of the switch 110 may then be determined based on $V_{SWITCH}$ and I in accordance with Ohm's law.

FIG. 1B shows the switch 110 in a non-conducting ('open' or 'off' state). The impedance of the switch 110 in this state is extremely high, such that negligible or zero current flows through the switch to the load 120. The voltage across the switch takes all, or almost all, of the supply voltage $V_{SUPPLY}$. Therefore, if $V_{SUPPLY}$ is a high voltage, for example 200V, $V_{SWITCH}$ may be approximately 200V. Consequently, it can be seen that the voltage measured by the voltage sensor 130 changes from a low-voltage (for example, in the order of millivolts) to a high-voltage (for example, in the order of 100s of volts). This is likely to damage the voltage sensor 130 as voltage sensors designed to measure low voltages accurately are not typically capable of withstanding high voltages.

Figure 2:
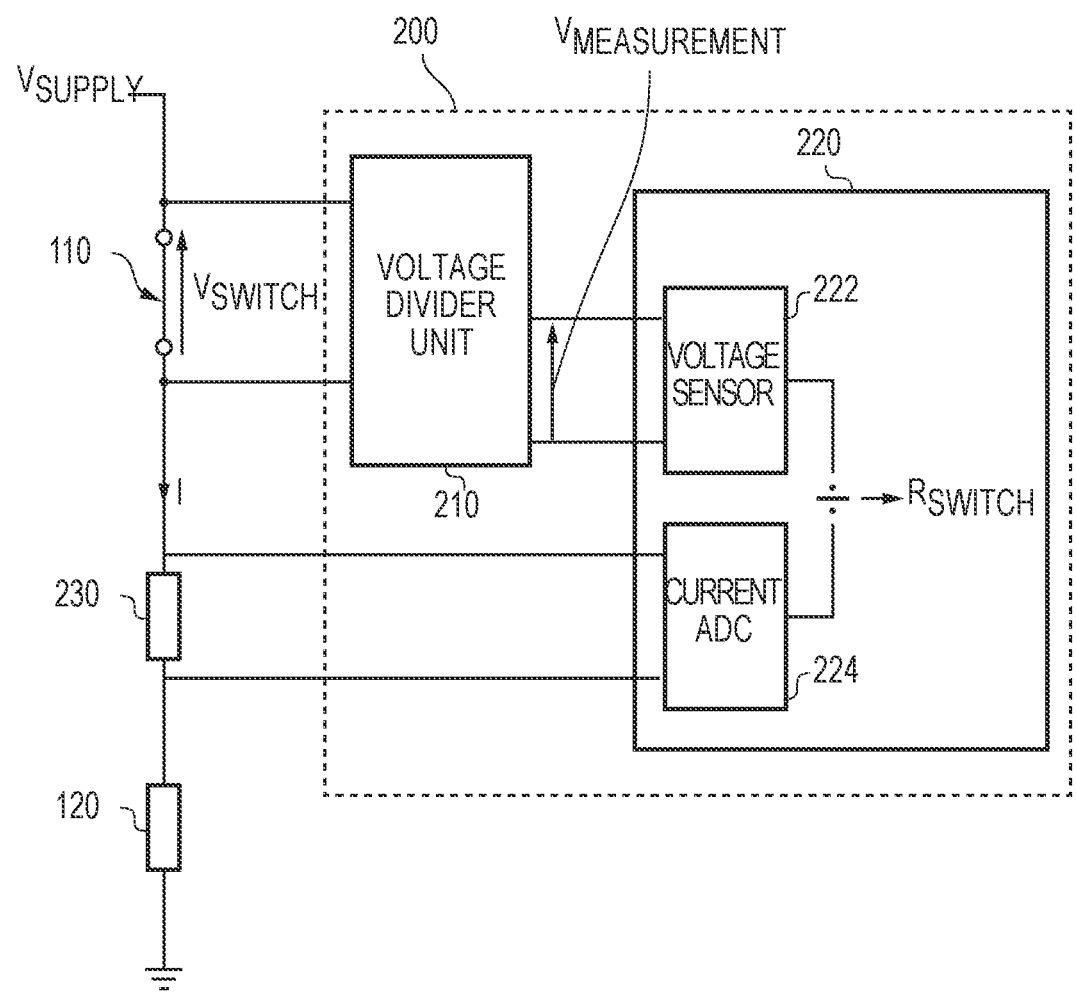
FIG. 2 shows an example system for monitoring a condition of switch, in accordance with aspect of the present disclosure.

FIG. 2 shows an example system 200 for monitoring a condition of the switch 110, in accordance with aspect of the present disclosure. The system 200 comprises a voltage divider unit 210 for coupling to the switch 110. The voltage divider unit 210 is configured to produce a voltage measurement signal, $V_{MEASUREMENT}$, that is dependent on, but smaller than, the voltage across the switch, $V_{SWITCH}$. Different ways in which the voltage divider unit 210 may be configured to achieve this functionality are described later. The system 200 also includes a switch condition monitor 220 coupled to the voltage divider unit 210 that is configured to determine the impedance of the switch $R_{SWITCH}$ and monitor the condition of the switch based at least in part on the determined impedance of the switch $R_{SWITCH}$. To determine the impedance of the switch $R_{SWITCH}$, the switch condition monitor 220 is configured to determine a measure of the voltage across the switch 110 and a measure of the current passing through the switch 110. To determine the measure of the voltage across the switch 110, the switch condition monitor 220 may comprise a voltage sensor 222 (for example, an ADC) configured to measure the signal $V_{MEASUREMENT}$ and then determine the measure of the voltage across the switch 110 based on $V_{MEASUREMENT}$ (for example, if the voltage divider unit 210 is configured to divide down $V_{SWITCH}$ by a ratio of 100:1 to produce $V_{MEASUREMENT}$, the measure of voltage across the switch 110 may be determine by multiplying up the measurement of the voltage sensor 222 by ×100). The measure of current in this example is determined using a current shunt 230 and an ADC 224. However, this is merely one example and in an alternative any suitable technique may be used (for example, in some circuits there may be other modules/apparatus that monitor the current flowing through the load 120, in which case the switch condition monitor 220 may not include the ADC 224, but instead may receive a measurement of the current I from some other module/apparatus. The switch condition monitor 220 can then determine a measurement of the conducting state impedance of the switch 110 by dividing the measure of voltage across the switch by the measure of current passing through the switch.

Whilst the impedance of the switch 110 may be determined from a single measure of voltage across the switch and current passing through the switch, in an alternative two or more measures of voltage across the switch and/or current passing through the switch may be made. The impedance of the switch 110 may then be determined from an average of the two or more measures of voltage and/or current. This may be particularly useful for the measure of voltage across the switch, because $V_{MEASUREMENT}$ is likely to be a very small signal when the switch 110 is in a conducting state. Before a measure of voltage and/or current is included in an averaging calculation, the switch condition monitor 220 may first confirm that the switch 110 is in the conducting state and only include the measure of voltage and/or current in the averaging calculation if it is satisfied that the switch 110 is in the conducting state. The switch condition monitor 220 may be configured to make this determination based on the magnitude of the measure of voltage and/or current, or based on control information for the switch 110. For example, the state of the switch 110 may be controlled by a control module (such as a safety module configured to control the gate voltage of the switch 110 when the switch is a FET device) and the switch condition monitor 220 may receive a signal from the control module indicative of the state of the switch 110. In this example, the control module and switch condition monitor 220 may be part of the same system, for example part of the same IC.

It will be appreciated that determining a measurement of conducting state impedance based on an average of measures of voltage and/or current is analogous to determining a measurement of conducting state impedance based on an average of two or more interim measurements of conducting state impedance, each interim measurement being determined based on a single measure of voltage and current.

The switch condition monitor 220 is configured to repeat this process over time, for example periodically or intermittently, in order to determine a plurality of measurements of conducting state impedance of the switch 110 over time. At least some of these measurements may be stored, for example in a memory module in the system 200 (for example, all of the plurality of measurements may be stored, or just the most recent n measurements). The condition of the switch 110 may then be monitored based on the plurality of measurements of impedance by identifying changes in impedance over time. For example, at least some of the plurality of measurements (for example, the most recently measurement of impedance, or the most recent 3 or 5 measurements of impedance, etc) may be compared against a reference impedance. The reference impedance may be a fixed amount that is indicative of the on-state impedance that the switch 110 should have (for example, as determined during switch manufacture, or according to the switch manufacturer's data sheet, etc). Alternatively, the switch condition monitor 220 may be configured to determine the reference impedance based on one or more earlier measurements of conducting state impedance for the switch 110. For example, the switch condition monitor 220 may determine an average impedance for the switch 110 based on two or more earlier measurements of impedance. Each new measurement of impedance may then be compared against that average in order to monitor the condition of the switch. Optionally, the average may be a moving average, such that each new measurement of impedance is then used to modify the average. Alternatively, the average may be fixed early in the life of the switch 110.

If the difference between the measurement of conducting state impedance and the reference impedance is greater than a fault threshold, the switch condition monitor 220 may be configured to generate a switch fault alert. The switch fault alert may be anything that is suitable for bringing a potential switch fault to the attention of a suitable entity/party. For example, it may be an alert message that is output via any suitable communications mechanism for the attention of maintenance personal, or other electronic/computing systems that manage the circuit in which the switch 110 operates, etc. The fault threshold may be a fixed amount that is set during manufacture/calibration of system 220, such that if the impedance of the switch 110 changes by more than an absolute amount, a switch fault is detected (for example, it may be set to any absolute value of resistance, such as 1Ω, or 3Ω, or 10Ω, etc). Alternatively, it may be a percentage amount of the threshold impedance (for example 5%, or 10%, etc), such that detection of a switch fault is relative to the particular reference impedance of the switch 110. The nature and size of the fault threshold may be set in consideration of at least one of: the type of switch 110; the type and requirements of the circuit in which the switch 110 is used; the size of the supply voltage, the requirements of the system 200, etc.

Optionally, the switch condition monitor 220 may intermittently generate a switch condition report, indicative of the condition of the switch 110. The switch condition report may comprise some or all of the measurements of impedance and/or an indication of the determined condition of the switch (for example, 'good', or 'deteriorating', or 'fault', etc). The switch condition report may be output using any suitable communication mechanism to any entity/unit/personal to whom an indication of the condition of the switch 110 may be useful.

Thus, it can be seen that the switch condition monitor unit 220 can monitor the condition of the switch and detect changes in the condition of the switch 110 based on the conducting state impedance. If the switch 110 starts to degrade, this change in condition can be detected and action may be taken to resolve the issue before the switch 110 starts to operate outside of acceptable limits and fail.

In this example, the supply voltage $V_{SUPPLY}$ is a high voltage. The voltage divider unit is designed to divide down the voltage across the switch $V_{SWITCH}$ by an amount that means that even if the switch 110 opens and $V_{SWITCH}$ increases to a high voltage, $V_{MEASUREMENT}$ will still be within the safe operational limits of the switch condition monitor unit 220. The amount by which the voltage divider unit reduces $V_{SWITCH}$ may depend on the expected maximum voltage of $V_{SUPPLY}$ and the design limits of the voltage sensor 222. Whilst this will mean that $V_{MEASURE}$ will be quite a small signal when the switch 110 is in a conducting state, the inventors have recognised that there are many voltage sensors 222 that should be capable of accurately measuring it.

Figure 3:
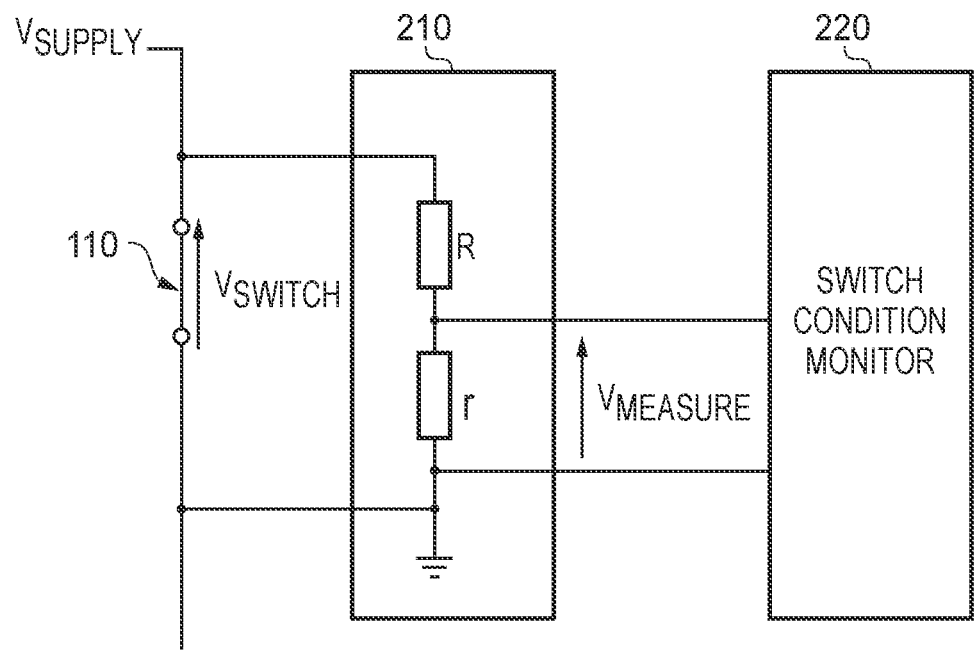
FIG. 3 shows an example implementation of the voltage divider unit of the system of FIG. 2.

FIG. 3 shows an example implementation of the voltage divider unit 210. Other details of the system 200 and the switch circuit have not been included in FIG. 3 for the sake of simplicity. The voltage divider unit 210 comprises a potential divider with two impedance elements R and r (for example, the two impedance elements may be resistors). Impedance element R has a relatively high impedance compared with impedance element r. In this example, $V_{MEASURE}$ is the voltage across element r, such that $V_{MEASURE}$ is smaller in magnitude than $V_{SWITCH}$. For example, the ratio of R:r may be 100:1, or 200:1, or 500:1, or 1000:1, or 2000:1, etc. In this way, $V_{MEASURE}$ will be orders of magnitude smaller than $V_{SWITCH}$ (for example, two or three orders of magnitude smaller), such that if $V_{SWITCH}$ becomes very large (for example 100s of volts), $V_{MEASURE}$ will be small enough not to damage components in the switch impedance monitor 220. For example, if $V_{SUPPLY}$ is 500V and R:r is 1000:1, when the switch is in a non-conducting state $V_{MEASURE}$ will be at about 0.5V, which should be well within the operating range of the voltage sensor 222. If $V_{SWITCH}$ reduces to about 1 mV when the switch 110 is in a conducting state, $V_{MEASURE}$ will be at about 1 μV, which is within the accurately measurable range of many voltage sensors, such as the Analog Devices product AD7770.

The size of impedance element R may be relatively large compared with the conducting-state impedance of the switch 110 (for example, R may be in the order of kiloohms or megaohms), so that the current draw of the voltage divider unit 210 is very low when the switch is both in its conducting and non-conducting states.

The switch condition monitor unit 220 may determine a measure of the voltage across the switch based $V_{MEASURE}$ (as measured by the voltage sensor 222) and the ratio of R:r. For example, it may multiply $V_{MEASURE}$ up by the ratio of R:r, such that if $V_{MEASURE}$ is measured to be 3 mV and the ratio R:r is 500:1, the voltage across the switch 110 would be determined to be about 1.5V. An accurate determination of the ratio R:r may be made in any suitable way, for example by using high accuracy impedance elements R and r and/or by measuring the ratio using any technique well understood by the skilled person and storing it's value in memory in the system 200 (and optionally intermittently re-measuring the ratio and storing the updated ratio in memory), etc.

Figure 4:
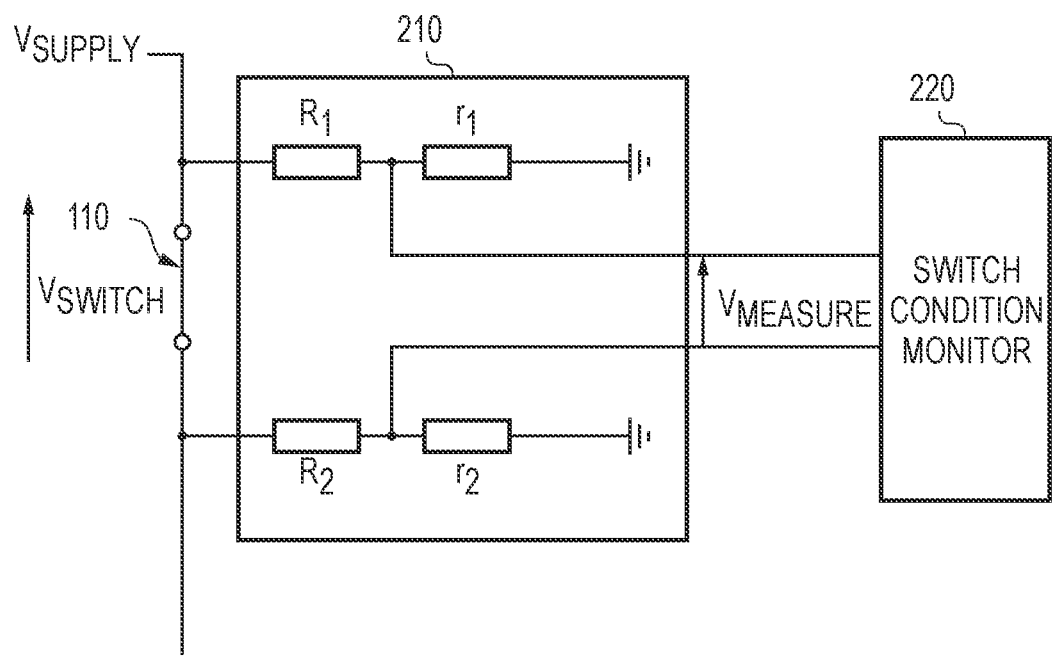
FIG. 4 shows a further example implementation of the voltage divider unit of the system of FIG. 2.

FIG. 4 shows a further example implementation of the voltage divider unit 210. In this configuration, the voltage divider unit 210 generates $V_{MEASURE}$ as a differential signal. By generating $V_{MEASURE}$ as a differential signal, it may be measured more accurately overtime compared with a single-ended signal, owing to superior common mode rejection. The voltage divider unit 210 comprises a first pair of impedance elements $R_1$ and $r_1$ and a second pair of impedance elements $R_2$ and $r_2$. The first pair are for coupling to a first switch terminal of the switch 110, for example the high voltage side of the switch 110. The second pair are for coupling to a second switch terminal of the switch 110, for example the lower voltage side of the switch 110. Similarly to the implementation of FIG. 3, $R_1$ may have an impedance that is larger than $r_1$, and $R_2$ may have an impedance that is larger than $r_1$. The signal $V_{MEASURE}$ is a differential signal that is a difference between a first voltage signal and a second voltage signal. The first voltage signal is the voltage across $r_1$ relative to a reference voltage (in this example, the reference voltage is ground) and the second voltage signal is the voltage across $r_2$ relative to the reference voltage.

The first voltage signal will have a magnitude that is dependent on, but smaller than, the voltage at the first terminal of the switch 110 relative to the reference voltage, and the second voltage signal will have a magnitude that is dependent on, but smaller than, the voltage at the second terminal of the switch 110 relative to the reference voltage. The amount by which the first signal is smaller than the voltage at the first terminal of the switch 110 may depend on the ratio $R_1:r_1$, and the amount by which the second signal is smaller than the voltage at the second terminal of the switch 110 may depend on the ratio $R_2:r_2$. Consequently, the differential signal $V_{MEASURE}$ is dependent on, but smaller than, the voltage across the switch $V_{SWITCH}$.

The switch condition monitor 220 may therefore determine a measure of voltage across the switch 110 based on $V_{MEASURE}$, the ratios $R_1:r_1$ and $R_2:r_2$, similarly to as described in respect of FIG. 3. Similarly to as described earlier, an accurate determination of the ratios $R_1:r_1$ and $R_2:r_2$ may be made in any suitable way, for example by using high accuracy impedance elements $R_1$, $r_1$, $R_2$ and $r_2$ and/or by measuring the ratios using any technique well understood by the skilled person and storing their values in memory in the system 200 (and optionally intermittently re-measuring the ratio and storing the updated ratio in memory), etc.

The conducting state impedance of the switch 110 may then be determined based on the measure of voltage across the switch 110 and the corresponding measure of current passing through the switch when the switch 110 is in the conducting state, as described earlier.

The ratios $R_1:r_1$ and $R_2:r_2$ may be set to be substantially the same and the ratios may be set based on the expected maximum voltage of $V_{SUPPLY}$ and the design limits of the voltage sensor 222, for example 100:1, or 500:1, or 1000:1, or 2000:1, etc (as explained earlier with respect to FIG. 3). Furthermore, the impedance of $R_1$ may be set to be substantially the same as that of $R_2$, and the impedance of $r_1$ may be set to be substantially the same as that of $r_2$. Alternatively, $R_1$ may be different to $R_2$, $r_1$ may be different to $r_2$, even if the ratios $R_1:r_1$ and $R_2:r_2$ are set to be substantially the same.

Figure 5:
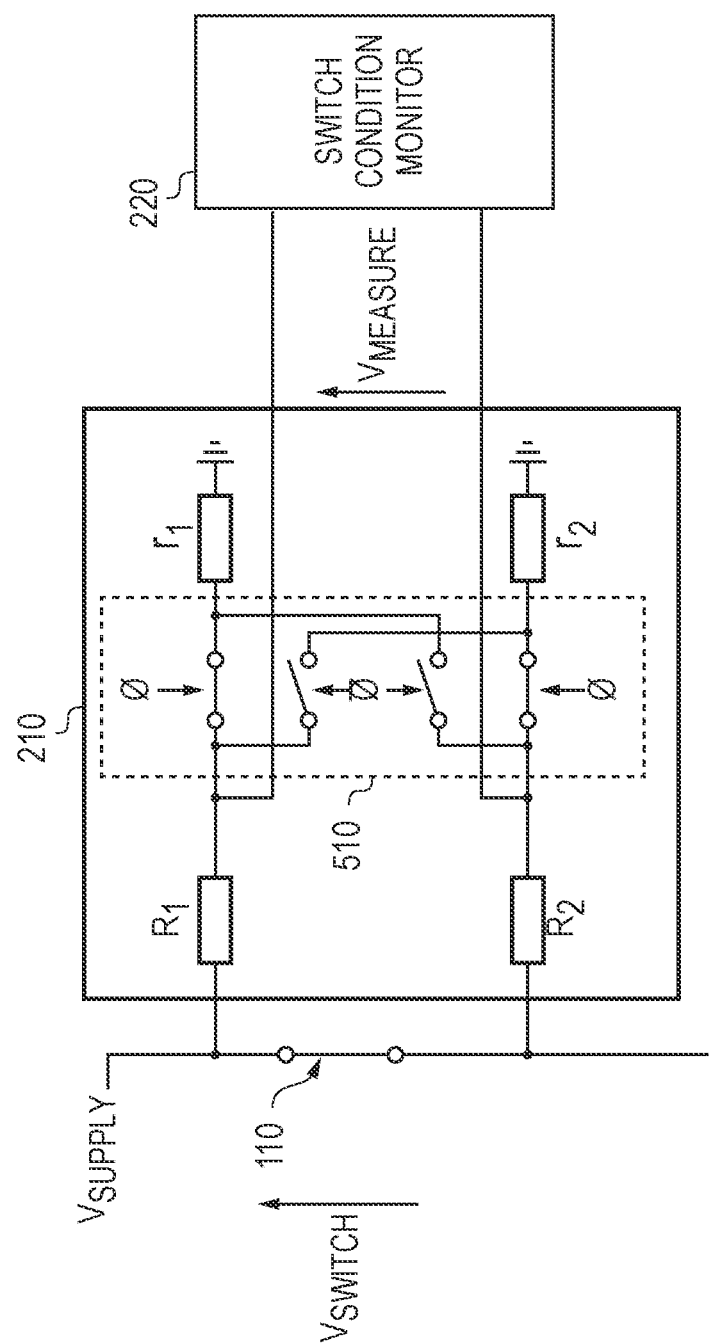
FIG. 5 shows a further example implementation of the voltage divider unit of the system of FIG. 2.

FIG. 5 shows a further example implementation of the voltage divider unit 210. This implementation is similar to that of FIG. 4, but includes a plurality of chop switches 510 to chop between the impedance elements of the voltage divider unit 210. The chop switches may be implemented using any suitable controllable switch, for example any suitable form of transistor, and may be controlled by any suitable entity or module (for example, the voltage divider unit 210 may be configured to control the operation of the switches, or the switch condition monitor 220 may control the operation of the switches, etc). The chop switches 510 may be controlled using control signals φ and $\overline{\varphi}$. When the chop switches are controlled to be in a first coupling state, the control signal φ controls its switches to couple $R_1$ to $r_1$ to form a first potential divider and to coupled $R_2$ to $r_2$ to form a second potential divider, and the control signal $\overline{\varphi}$ controls its switches to be open, or non-conducting. When the chop switches are controlled to be in a second coupling state, the control signal $\overline{\varphi}$ controls its switches to couple $R_1$ to $r_2$ to form a third potential divider and to coupled $R_2$ to $r_1$ to form a fourth potential divider, and the control signal $\overline{\varphi}$ controls its switches to be open, or non-conducting.

The switch condition monitor 220 may determine the measure of voltage across the high voltage switch based on $V_{MEASURE}$ when the plurality of chop switches 510 are in the first coupling state and $V_{MEASURE}$ when the plurality of chop switches 510 are in the first coupling state. For example, it may take the average of the two instances of $V_{MEASURE}$ and then multiply the average by the ratio of R:r in order to arrive at the measure of voltage across the switch 110. A benefit of this configuration is that where $R_1$ and $R_2$ have the same design impedance as each other, and $r_1$ and $r_2$ have the same design impedance as each other, chopping their coupling and taking an average of $V_{MEASURE}$ may correct for any actual mismatch between the impedances that exist as a result of manufacturing tolerances of the impedance elements $R_1$, $R_2$, $r_1$ and $r_2$. Consequently, it may be possible to arrive at a more accurate measure of the voltage across the switch 110 that corrects for any mismatch between impedance elements.

Figure 6:
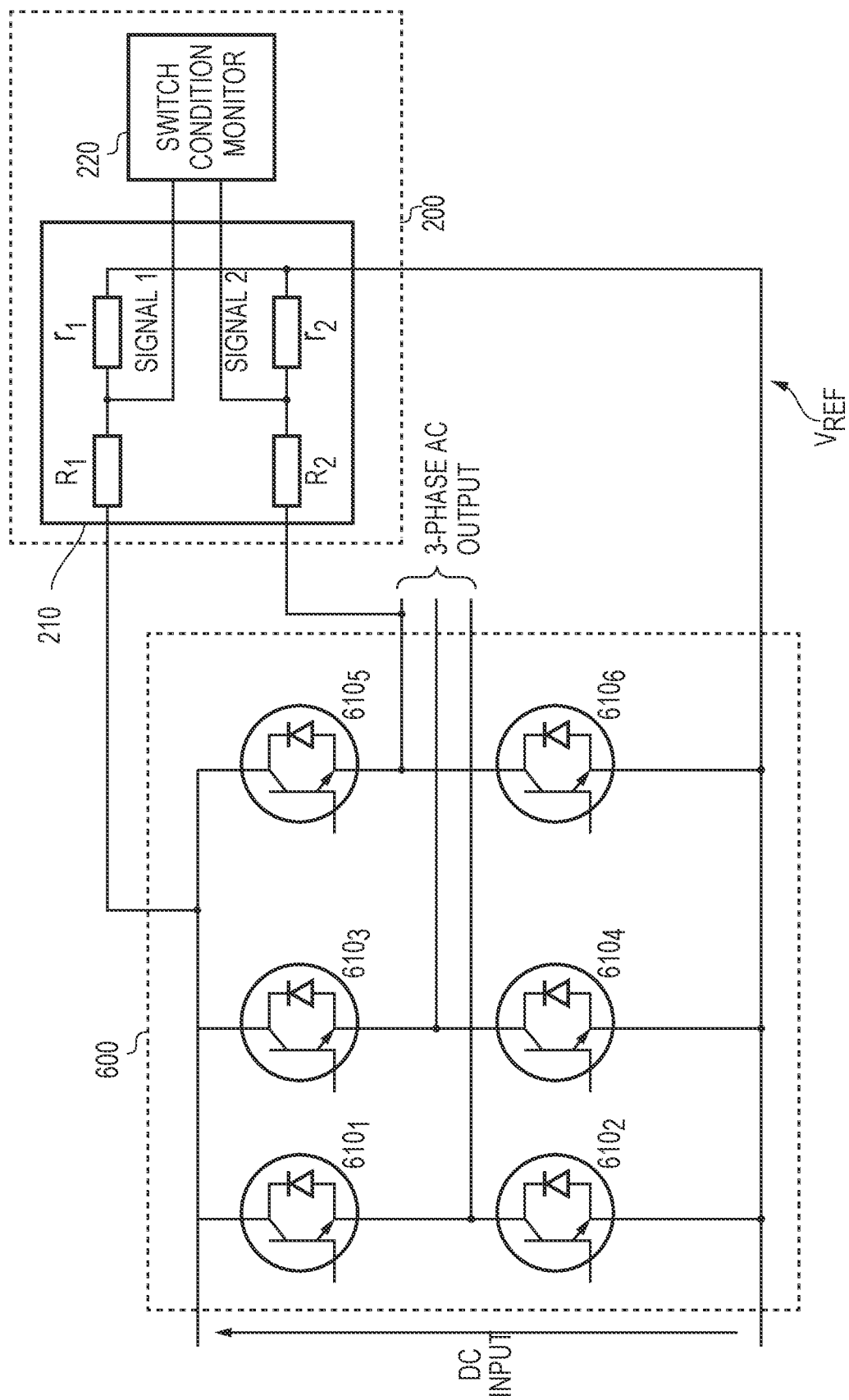
FIG. 6 shows an example of the system of FIG. 2 used to monitor one or more switches in an electrical conversion circuit.

FIG. 6 shows, by way of example only, an electrical conversion circuit 700 with which the system 200 may be used. The electrical conversion circuit 700 is an inverter configured to perform DC-AC conversion, for example to drive an AC motor. The circuit 700 comprises six IGBTs (although there may be any number of any other suitable type of switching device), $610_1$ to $610_6$, each of which is a switch whose condition may be monitored using the system 200 described above. In this example of FIG. 6, the system 200 is coupled to two of the IGBTs 610₅ to 610₆, although it may be used to monitor the condition of any one or more of the IGBTs.

To determine the conducting state impedance of IGBT 610₆, the switch condition monitor unit 220 may use signal 2 as a single ended signal that is indicative of the voltage across $r_2$ relative to $V_{REF}$ (which is a voltage that is dependent on, but smaller than, the voltage across the IGBT 610₆). Therefore, the switch condition monitor 220 may determine a measure of the voltage across the IGBT 610₆ during its conducting state using the signal 2 in the same way as described with respect to FIG. 3. The current passing through the IGBT 610₆ may be determined in any suitable way, for example, using a current shunt or current transformer coupled in series between IGBT 610₆ and $V_{REF}$. Alternatively, in a number of inverter circuits, current measurement functionality is already built into the circuit to monitor the current at various points in the circuit, in which case the switch condition monitor 220 may make use of these measurements. The impedance of the IGBT 610₆ may then be determined based on the measure of voltage across the IGBT 610₆ and the measure of current flowing through the IGBT 610₆.

To determine the conducting state impedance of IGBT 610₅, the switch condition monitor 220 may use signal 1 and signal 2 as a differential signal that is indicative of a difference between the voltage across $r_1$ (which is a voltage that is dependent on, but smaller than, the voltage at a first terminal of the IGBT 610₅ relative to $V_{REF}$) and the voltage across $r_2$ (which is a voltage that is dependent on, but smaller than, the voltage at a second terminal of the IGBT 610₅ relative to $V_{REF}$). Therefore, the difference between signal 1 and signal 2 is indicative of the voltage across IGBT 610₅ and so the switch condition monitor 220 may determine a measure of the voltage across the IGBT 610₅ during its conducting state using the difference between signal 1 and signal 2, in the same way as described with respect to FIG. 4. The current passing through the IGBT 610₅ may be determined in any suitable way, for example using a current shunt or transformer in series with the AC output line coupled to IGBT 610₅, or using current measurements taken using current measurement functionality already built into the inverter circuit. The impedance of the IGBT 610₅ may then be determined based on the measure of voltage across the IGBT 610₅ and the measure of current flowing through the IGBT 610₅.

Consequently, it can be seen that the voltage divider unit 210 may be configured to output a voltage measurement signal that can be used to generate a single ended signal or a differential signal, as necessary. Whilst this benefit is represented particularly in the context of the electrical conversion circuit 700, it should be appreciated that it may be applicable to many other types of circuit.

In all of the different implementations of the system 200, the system 200 makes use of a measurement of the load or supply current I passing through the switch 110 when it is in its conducting state during normal operation, and a measurement of the corresponding voltage $V_{SWITCH}$ across the switch 110 that is induced by the load or supply current. A dedicated simulation signal is not required for the system 200 to work, so the system 200 may operate more straightforwardly, with greater reliability and lower implementation and operation costs. Furthermore, the system 200 operates 'passively', in that it may be continuously coupled to the switch 110, in contrast to a system that may selectively couple measurement apparatus only at particular times when it is deemed safe to do so (for example, coupled only at times when it is known that the switch is in a conducting state and there has a sufficiently low switch voltage $V_{SWITCH}$ not to damage the measurement apparatus). Consequently, the system 200 may be able to monitor the conducting state impedance of the switch more straightforwardly, at any time, without requiring complex control, whilst still being able to withstand sudden, unexpected increases in switch voltages caused by the switch opening (which may be particularly useful for protection/circuit breaker circuits). Consequently, the system 200 may be more straightforward and lower cost to implement and operate, and may require less power to operate over time.

The skilled person will readily appreciate that various alterations or modifications may be made to the above described aspects of the disclosure without departing from the scope of the disclosure.

For example, where the voltage supply is not a high voltage, the voltage across the switch 110 when the switch is in a non-conducting state may be within the design limits of the switch condition monitor 220. In this case, the voltage divider unit 210 may be omitted and the switch condition monitor 220 may be coupled directly to the switch 110 and determine the measure of voltage across the switch 110 directly.

Whilst some specific example implementation of voltage divider units 210 are given, it will be appreciated that the voltage divider unit 210 may be implemented in any suitable way that enables it to produce a voltage measurement signal $V_{MEASURE}$ that is dependent on, but smaller in magnitude than, the voltage across the signal 110. For example, it may comprise one or more impedance dividers similar to those represented in FIGS. 3-5, but one of the impedance elements in each impedance divider may be a capacitor rather than a resistor.

In some implementations the voltage sensor 222 may comprise an ADC whose inputs are directly coupled to the voltage divider unit 210 in order to measure directly $V_{MEASUREMENT}$. In other implementations, the voltage sensor 222 may comprise an ADC and an amplifier (for example, a low noise amplifier, LNA), where the amplifier is coupled to the voltage divider unit 210 in order to amplify the signal $V_{MEASUREMENT}$ before it is measured by the ADC. In this example, when the switch 110 is in a conducting state, $V_{MEASUREMENT}$ may be very low (potentially in the order of μVs), so gain provided may amplify the signal (for example, into the mVs or 1V range), which may be beneficial to the ADC in determining an accurate voltage measurement and make it possible to use a wider range of ADCs. When the switch 110 is in a non-conducting state, $V_{MEASUREMENT}$ will increase, but the output signal of the amplifier in the voltage sensor 222 may saturate to the maximum voltage of the amplifier (for example, the supply voltage of the amplifier). The amplifier used may be set so that its saturation voltage is within the tolerances of the ADC so that the ADC is protected. Furthermore, the fact that the voltage output of the amplifier saturates when the switch 110 is in a non-conducting state is acceptable because there is no reason to measure the voltage across the switch 110 when it is in a non-conducting state.

The switch condition monitor 220 may be implemented by software, hardware or a combination of software and hardware. For example, its functionality may be implemented within a microcontroller, or processor, or any other suitable logic or circuit. Alternatively, its functionality may be implemented by software comprising computer readable code, which when executed on one or more processors performs the functionality described above. The software may be stored on any suitable computer readable medium, for example a non-transitory computer-readable medium, such as read-only memory, random access memory, CD-ROMs, DVDs, Blue-rays, magnetic tape, hard disk drives, solid state drives and optical drives. The computer-readable medium may be distributed over network-coupled computer systems so that the computer readable instructions are stored and executed in a distributed way.

The invention claimed is:

1. A system for monitoring a condition of a switch, the system comprising:
a switch condition monitor unit configured to:
determine a plurality of measurements of impedance of the switch over time, the plurality of measurements of impedance comprising a first impedance measurement determined at a first point in time and a second impedance measurement determined at a second point in time that is later than the first point in time, each of the first and second impedance measurements being based on a respective combination of voltage and current;
determine that the switch is in a conducting state at the first point in time when the first impedance measurement is determined;
derive a value from the first impedance measurement in response to determining that the switch is in the conducting state at the first point in time when the first impedance measurement is determined;
after deriving the value, compute a difference between the second impedance measurement and the value derived from the first impedance measurement that was determined when the switch was in the conducting state; and
based at least in part on computing the difference between the second impedance measurement and the value derived from the first impedance measurement, monitor and determine a fault condition associated with the switch.

2. The system of claim 1, wherein at least some of the plurality of measurements of impedance are determined while the switch is in a conducting state, the switch condition monitor unit being configured to receive inputs associated with the switch while the switch is in the conducting state and while the switch is in a non-conducting state.

3. The system of claim 2, wherein the switch condition monitor unit is configured to monitor the condition of the switch by comparing at least one of the plurality of measurements of conducting state impedance against a reference impedance.

4. The system of claim 3, wherein the reference impedance is based on at least one earlier measurement of conducting state impedance of the switch.

5. The system of claim 3, wherein the switch condition monitor unit is further configured to:
generate a switch fault alert, in response to a difference between the at least one of the plurality of measurements of conducting state impedance and the reference impedance being greater than a fault threshold.

6. The system of claim 1, wherein the value derived from the first impedance measurement comprises an average of two or more earlier measurements of conducting state impedance of the switch, wherein the first impedance measurement is included in the average of the two or more earlier measurements in response to determining that the switch is in the conducting state at the first point in time when the first impedance measurement is determined, and wherein the average of the two or more earlier measurements is fixed at a given point in a life of the switch and is later used to compute the difference between the second impedance measurement and the value.

7. The system of claim 1, wherein the switch is a high voltage switch that is rated to withstand a high voltage when the switch is in a non-conducting state, and
wherein the switch condition monitor unit is configured to determine the plurality of measurements of impedance of the switch by:
determining a plurality of measures of voltage across the switch and a corresponding plurality of measures of current passing through the switch; and
determining the plurality of measurements of impedance of the switch based on the plurality of measures of voltage across the switch and corresponding plurality of measures of current passing through the switch.

8. The system of claim 7, further comprising:
a voltage divider unit for coupling to the switch, wherein the voltage divider unit is configured to produce a voltage measurement signal that is dependent on, but smaller in magnitude than, the voltage across the switch,
wherein the switch condition monitor unit is coupled to the voltage divider unit and configured to determine the plurality of measures of voltage across the switch based at least in part on the voltage measurement signal.

9. The system of claim 8, wherein the voltage divider unit comprises:
a potential divider for coupling to the high voltage switch, wherein the potential divider comprises two impedance elements, one of which has a larger impedance than another, and
wherein the voltage measurement signal is indicative of a voltage across a smaller impedance element of the potential divider.

10. The system of claim 9, wherein the switch condition monitor unit is further configured to determine the plurality of measures of voltage across the switch based at least in part on a ratio of impedances of the two impedance elements.

11. The system of claim 8, wherein the voltage divider unit comprises:
a first pair of impedance elements for coupling to a first switch terminal of the high voltage switch, the first pair of impedance elements comprising a first impedance element having a first impedance and a second impedance element having a second impedance, wherein the first impedance is greater than the second impedance; and
a second pair of impedance elements for coupling to a second switch terminal of the high voltage switch, the second pair of impedance elements comprising a third impedance element having a third impedance and a fourth impedance element having a fourth impedance, wherein the third impedance is greater than the fourth impedance.

12. The system of claim 11, wherein the voltage measurement signal comprises:
a first voltage signal indicative of a voltage across the second impedance element relative to a reference voltage, and
a second voltage signal indicative of a voltage across the fourth impedance element relative to the reference voltage.

13. The system of claim 11, wherein the voltage divider unit comprises:
a plurality of chop switches operable in a first coupling state and a second coupling state, wherein when the plurality of chop switches are in the first coupling state, they are configured to:
couple the first impedance element to the second impedance element to form a first potential divider; and
couple the third impedance element and the fourth impedance element to form a second potential divider; and
wherein when the plurality of chop switches are in the second coupling state, they are configured to:
couple the first impedance element to the fourth impedance element to form a third potential divider; and
couple the third impedance element and the second impedance element to form a fourth potential divider.

14. The system of claim 13, wherein determination of the measure of the voltage across the high voltage switch is further based at least in part on:
the voltage measurement signal when the plurality of chop switches are in the first coupling state; and
the voltage measurement signal when the plurality of chop switches are in the second coupling state.

15. The system of claim 1, wherein the switch condition monitor is configured to generate a switch condition report indicative of the fault condition associated with the switch, the switch condition report comprising the plurality of measurements of impedance and an indication of the determined fault condition, the fault condition indicted in the switch condition report being one of a plurality of fault types.

16. The system of claim 15, wherein the switch condition report is presented to an entity.

17. The system of claim 1, wherein the switch condition monitor unit is further configured to store the plurality of measurements of impedance in a memory.

18. The system of claim 1, in combination with a high voltage circuit comprising:
a high voltage power source;
a load for receiving power from the high voltage power source; and
a high voltage switch arranged to couple the high voltage power source to the load when in a conducting switch state and decouple the high voltage power source from the load when in a non-conducting switch state; and
wherein the switch condition monitor unit is coupled to the high voltage switch and configured to monitor the condition of the high voltage switch.

19. An apparatus comprising:
means for determining a plurality of measurements of impedance of a switch over time, the plurality of measurements of impedance comprising a first impedance measurement determined at a first point in time and a second impedance measurement determined at a second point in time that is later than the first point in time, each of the first and second impedance measurements being based on a respective combination of voltage and current;
means for determining that the switch is in a conducting state at the first point in time when the first impedance measurement is determined;
means for deriving a value from the first impedance measurement in response to determining that the switch is in the conducting state at the first point in time when the first impedance measurement is determined;
means for, after deriving the value, computing a difference between the second impedance measurement and a value derived from the first impedance measurement that was determined when the switch was in the conducting state; and
means for monitoring and determining a fault condition associated with the switch based at least in part on the difference.

20. A method of monitoring a condition of a switch, the method comprising:
determining a plurality of measurements of impedance of the switch over time, the plurality of measurements of impedance comprising a first impedance measurement determined at a first point in time and a second impedance measurement determined at a second point in time that is later than the first point in time, each of the first and second impedance measurements being based on a respective combination of voltage and current;
determining that the switch is in a conducting state at the first point in time when the first impedance measurement is determined;
deriving a value from the first impedance measurement in response to determining that the switch is in the conducting state at the first point in time when the first impedance measurement is determined;
after deriving the value, computing a difference between the second impedance measurement and a value derived from the first impedance measurement that was determined when the switch was in the conducting state; and
monitoring and determining a fault condition associated with the switch based at least in part on the difference.

* * * * *